United States Patent [19]
Glaser

[11] Patent Number: 5,834,653
[45] Date of Patent: Nov. 10, 1998

[54] MEASURING DEVICE WITH A PIEZOELECTRIC MEASURING ELEMENT POSITIONED BETWEEN TWO SUPPORTS AND DIVIDED INTO A PLURALITY OF ROD-, ROLLER-, OR RIB-SHAPED ELEMENTS

[75] Inventor: Josef Glaser, Graz, Austria

[73] Assignee: AVL List GmbH, Graz, Austria

[21] Appl. No.: 766,454

[22] Filed: Dec. 12, 1996

[30] Foreign Application Priority Data

Dec. 15, 1995 [AT] Austria ................................ A 2032/95

[51] Int. Cl.⁶ .................................................... G01B 7/16
[52] U.S. Cl. .............................................................. 73/774
[58] Field of Search ...................... 73/774, 777, 862.623, 73/862.625

[56] References Cited

U.S. PATENT DOCUMENTS 5,402,684  4/1995  Engeler et al. ............................ 73/794
5,616,847  4/1997  Schlapfer ................................... 73/774

Primary Examiner—George M. Dombroske
Assistant Examiner—Paul D. Amrozowicz
Attorney, Agent, or Firm—Watson Cole Grindle Watson, P.L.L.C.

[57] ABSTRACT

A measuring device is provided with a piezoelectric measuring element which is positioned between two force-transmitting supports and exhibits anisotropic thermal expansion and lateral extension behavior relative thereto in a plane normal to the direction of force application. The piezoelectric measuring element, or the end regions of the two supports adjacent to the piezoelectric measuring element, are divided into several rod-, roller-, or rib-shaped elements, the two supports and the piezoelectric measuring element exhibiting essentially the same thermal expansion or lateral extension in longitudinal direction of the rod-, roller-, or rib-shaped elements.

14 Claims, 6 Drawing Sheets

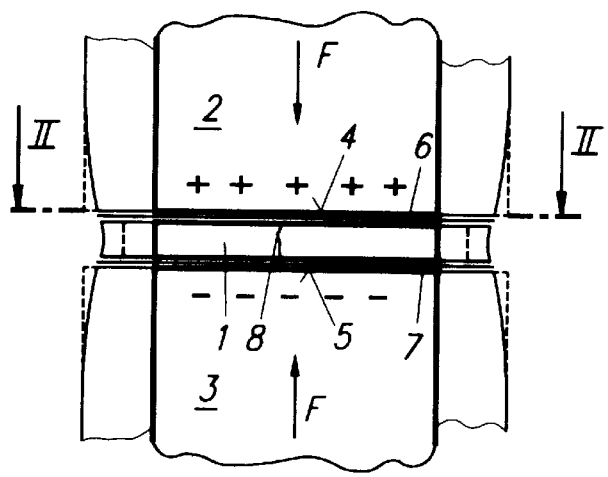
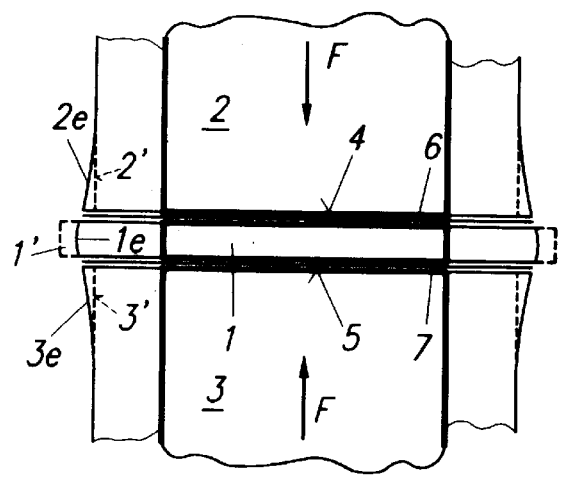
Fig. 2A  Fig. 2B
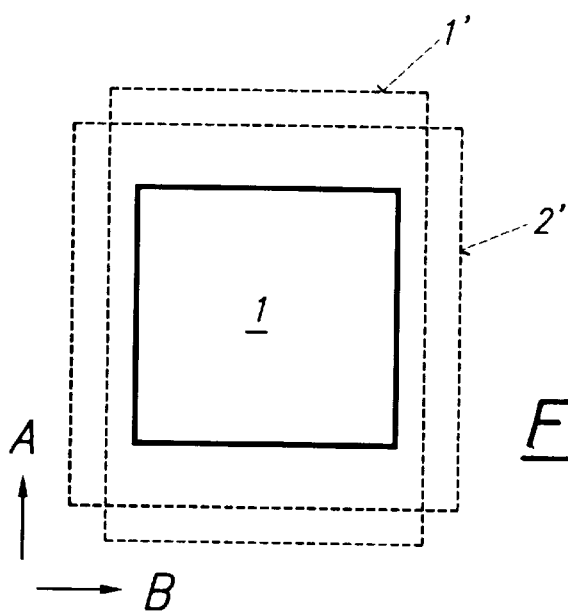
Fig. 2C

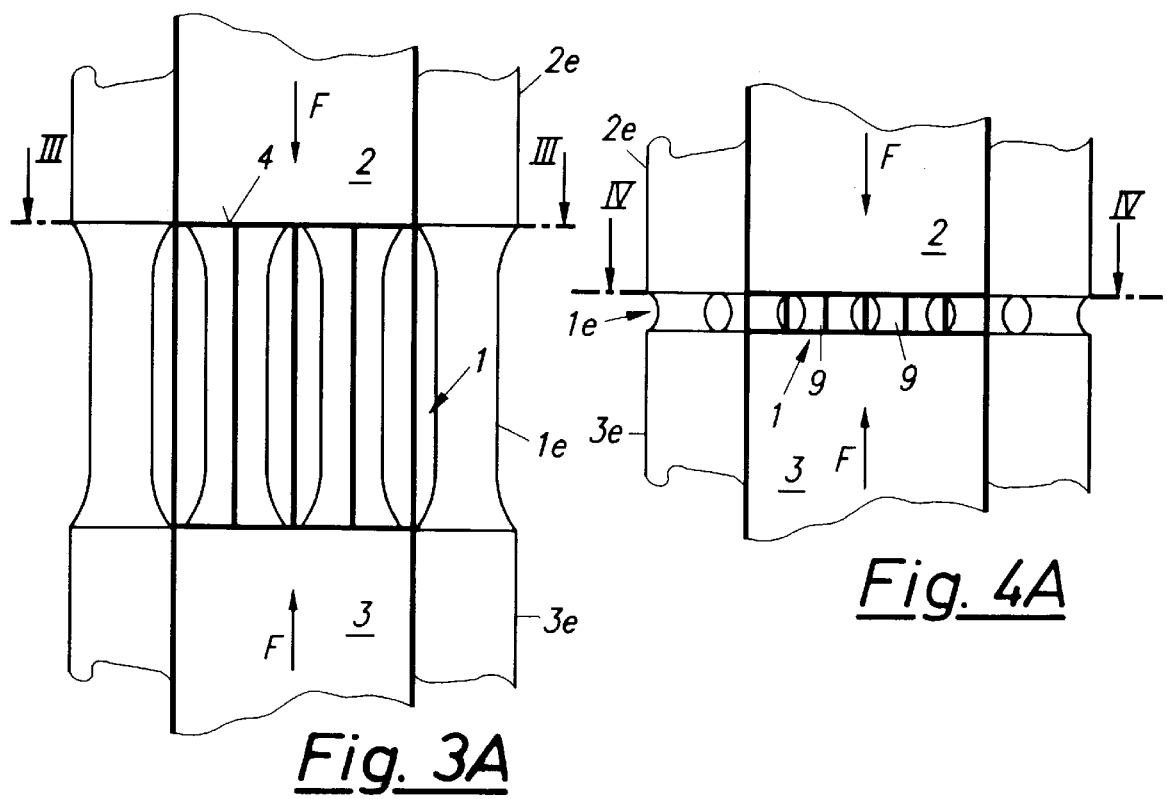
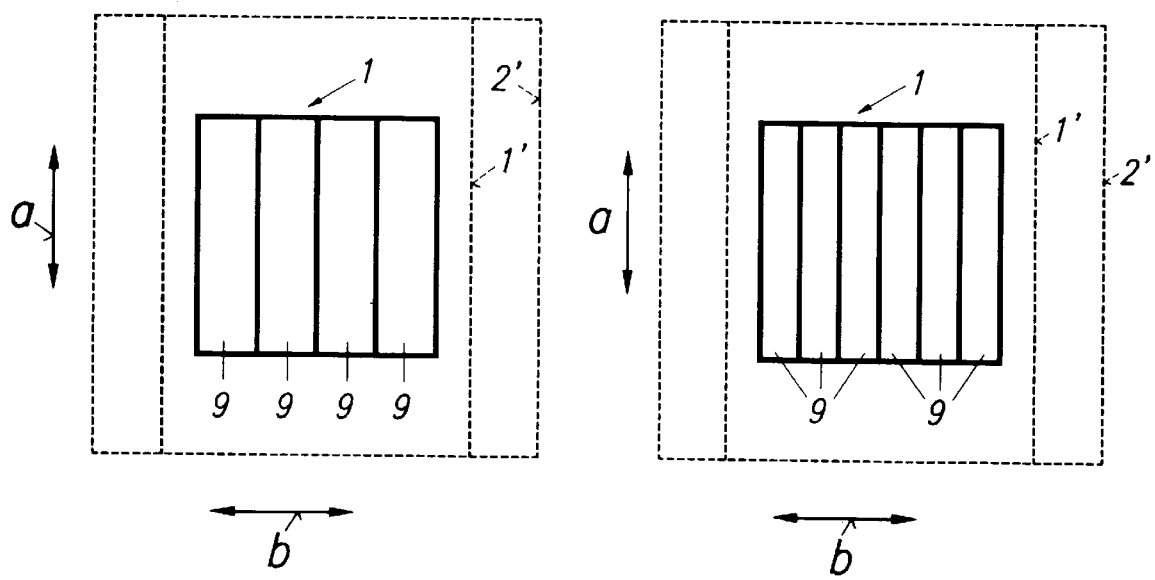

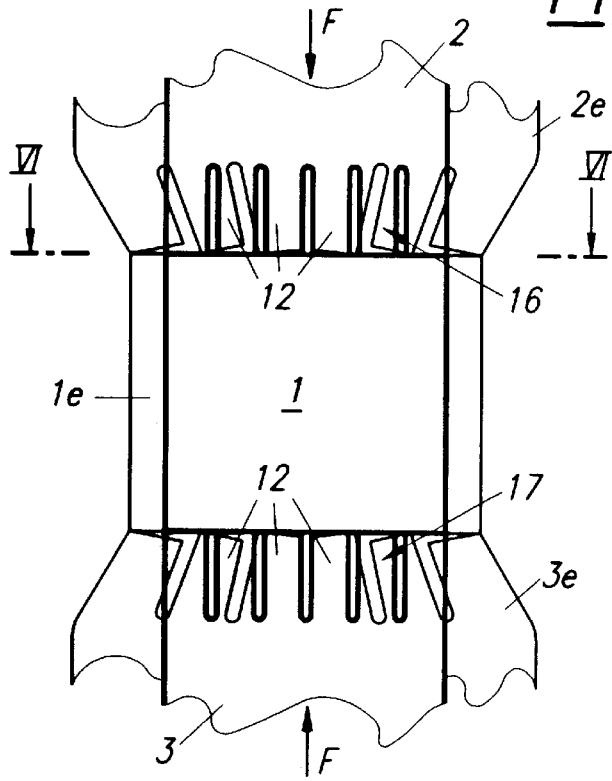

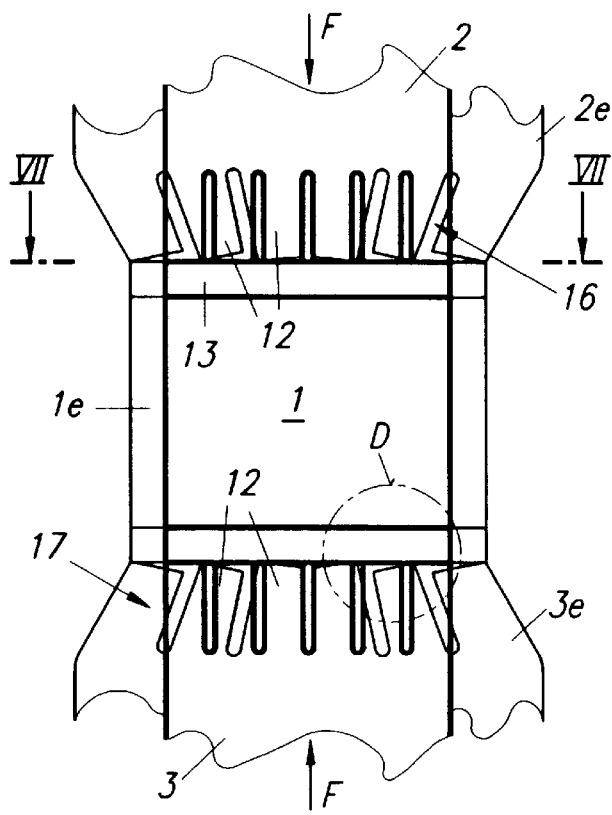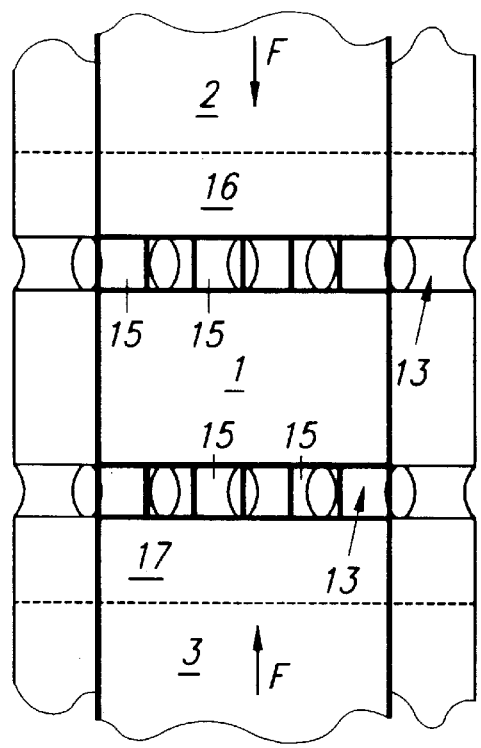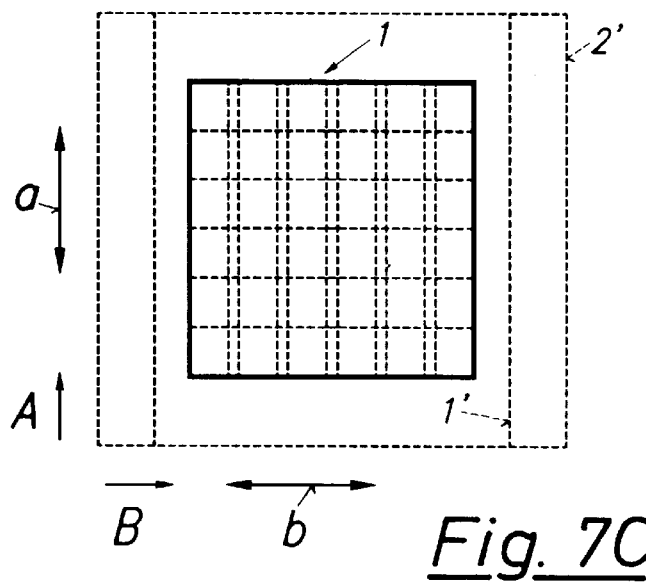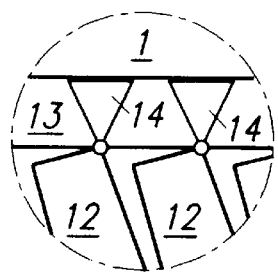

5,834,653

MEASURING DEVICE WITH A PIEZOELECTRIC MEASURING ELEMENT POSITIONED BETWEEN TWO SUPPORTS AND DIVIDED INTO A PLURALITY OF ROD-, ROLLER-, OR RIB-SHAPED ELEMENTS

BACKGROUND OF THE INVENTION

The present invention relates to a measuring device with a piezoelectric measuring element which is positioned between two force-transmitting supports and exhibits anisotropic thermal expansion and lateral extension behavior relative thereto in a plane normal to the direction of force application, the measuring element being held in this plane by the friction forces at the two supports.

Piezocrystals tend to give off electrical charges upon the application of forces. This effect is utilized for force measuring.

Apart from a number of excellent properties, piezocrystals feature a property that is quite undesirable in making force-measuring elements, i.e., the anisotropic behavior of some material characteristics, such as thermal expansion or lateral extension, under the influence of mechanical stress. The actual piezoelectric measuring element is usually adjacent to a housing, or at least force-transmitting supports, which do not exhibit anisotropic behavior of the same order of magnitude as found in the piezocrystals. For this reason the conditions usually encountered at the interface between the anisotropic crystal and the isotropic support are as shown in FIGS. 1A to 2C. Under the influence of pressure or heat the measuring element and the support will exhibit different expansion at the contact faces, at least in one direction; as a consequence, sliding under friction will occur between the parts, or strong strains of both supporting and measuring element, since the expansion of isotropic and anisotropic materials can be matched in one direction at best. The material of the pressure-transmitting element or support is mostly selected in such a way that both its thermal expansion coefficient and lateral extension coefficient lie between the respective extreme values of the crystal as measured in the plane of the contact surface; as a consequence, the extent of strains or sliding movements is limited.

The stresses caused by the anisotropy may destroy the support or the crystal, the latter particularly in the instance of the thin measuring elements frequently used for utilization of the so-called longitudinal piezoeffect, for example, where the charge is picked up in the compressed face. In such instances the frictional forces accumulated over large areas act on a comparatively small cross-section normal to these forces.

Strains in the crystal will also affect the amount of charge generated, i.e., the measurement signal. As long as such strains are produced by the force to be measured and by the lateral extension proportional thereto, and are thus proportional to the force, they will not affect the measurement in any way. In most cases, however, sliding friction will occur in parts of the compressed face between crystal and support, accompanied by hysteresis effects in the measurement signal, which are of course undesirable. Both in the longitudinal elements and in the transversal elements (charge is produced at a crystal surface transverse to the load acting on the crystal), large areas of the crystal element are subject to such strains at the interface between isotropic and anisotropic material. In the same manner temperature-dependent strains will occur at the interface between crystal and support, which are just as undesirable. Charges, or signal components derived from such pressure-independent stress components, will lead to errors in the measured result.

SUMMARY OF THE INVENTION

It is an object of the present invention to improve the measuring device described above in such a way that pressure-independent stress components are largely avoided at the interface of support and piezoelectric measuring element.

In the invention this object is achieved by dividing the piezoelectric measuring element or the end regions of the two supports adjacent to the piezoelectric measuring element, into several rod-, roller-, or rib-shaped elements, and by providing that the two supports and the piezoelectric measuring element exhibit essentially the same thermal expansion or lateral extension in longitudinal direction of the rod-, roller-, or rib-shaped elements, normal to the direction of force application. The above problems are thus eliminated or minimized by giving the measuring element and/or the support an "anisotropic shape".

It is especially provided by the invention that the supports consist of isotropic material and the piezoelectric measuring element be divided into slender rod-shaped elements whose thermal expansion and lateral extension is essentially the same in longitudinal direction as that of the isotropic supports, or, that the end regions of the two supports of isotropic material adjacent to the piezoelectric measuring element have rib-shaped elements, rollers or roller segments, whose thermal expansion and lateral extension is matched in longitudinal direction with that of the piezoelectric measuring element.

DESCRIPTION OF THE DRAWINGS

Following is a more detailed description of the invention with reference to the accompanying drawings, in which FIGS. 3A–9 show variants of a measuring device in accordance with the present invention.

DETAILED DESCRIPTION OF THE PREFERRED EMBODIMENTS

Figure 1A:
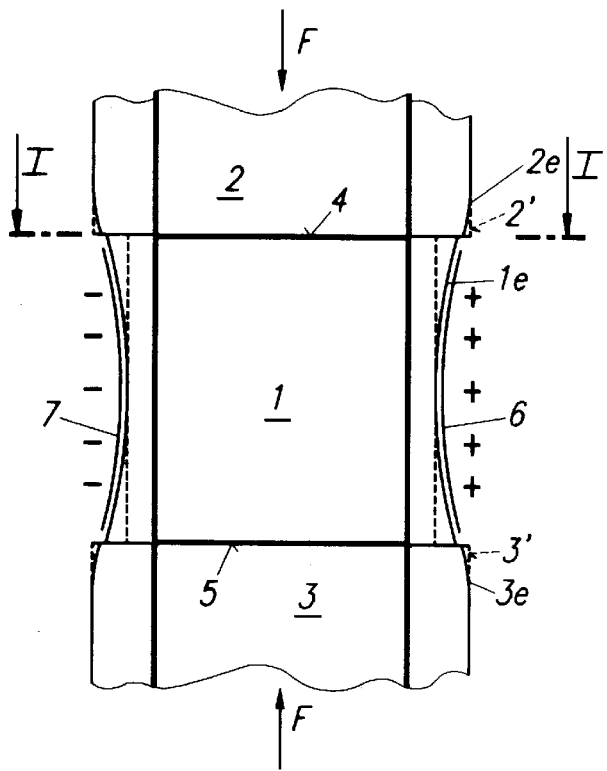
FIGS. 1A–1C show a conventional measuring device with a transversal element, FIGS. 2A–2C a conventional measuring device with a longitudinal element, each in various schematical views.
Figure 1B:
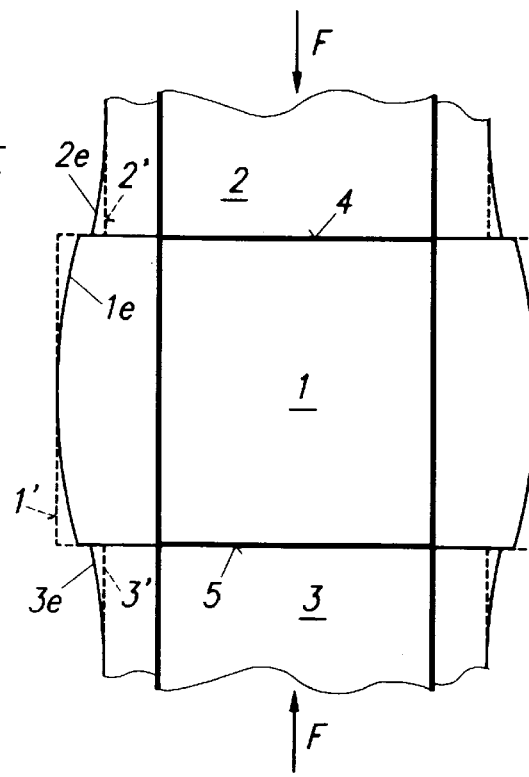
Figure 1C:
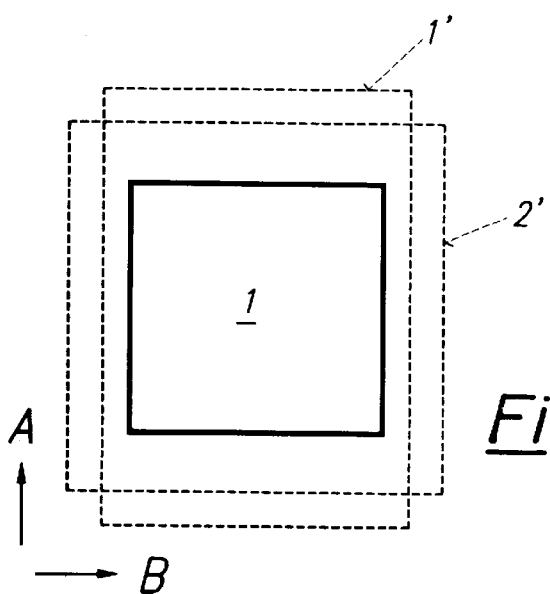
Figure 8:
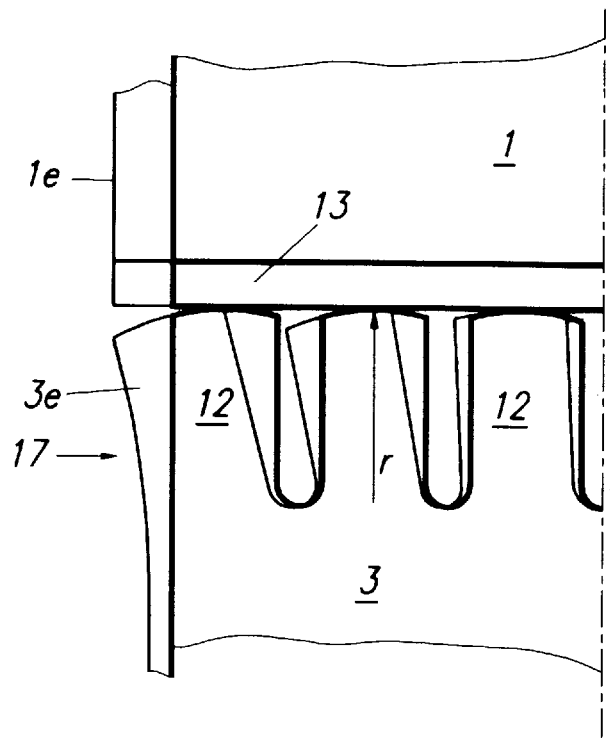

FIGS. 1A to 1C give a schematical representation of a conventional measuring device with a piezoelectric measuring element 1 (transversal element) positioned between two force-transmitting supports 2 and 3, and subject to a force F. In the transversal element the charge-producing surfaces are normal to the two compressed faces 4, 5, and are provided with electrodes 6, 7 picking up the charges.

Under the influence of heat, the anisotropic measuring element 1 between the isotropic pressure-transmitting pieces or supports 2 and 3, is subject to strains, which are shown in FIGS. 1A to 1C in exaggerated form, broken lines 1' representing the theoretical shape of the measuring element 1 uninfluenced by any adjacent material, and 2' and 3' that of the two supports 2 and 3, after expansion of the measuring device due to thermal or pressure loads. FIG. 1C (cut view along line I—I in FIG. 1A) shows that the anisotropic measuring element 1' exhibits greater thermal expansion (or lateral extension) in direction A than the support 2', where as the reverse is true for direction B. Due to the different expansion behaviors of measuring element 1 and supports 2, 3, strains will occur in the area of the compressed faces 4, 5, which manifest themselves as constrictions in direction B (see FIG. 1A), and as bulges of the measuring element in direction A (see FIG. 1B). The outer contour of the measuring element obtained after application of thermal load or pressure load has the reference 1e, that of the two supports is referred to as 2e or 3e. The thermal expansion taking place in the direction of the applied pressure forces F is not shown in the drawings.

Similar circumstances prevail with a longitudinal element in a conventional measuring device, as shown in FIGS. 2A to 2C. In a measuring element 1 utilizing the longitudinal effect, charge pickup takes place by means of electrodes 6, 7 in the compressed faces 4, 5. Because of the thinness of the longitudinal elements the risk of breaking due to strong tensile stresses in area 8 is high.

FIGS. 3A to 9 represent embodiments of the measuring device described by the invention, FIGS. 3A, 3B and 4A, 4B showing variants in which the crystal block of the measuring element 1 is divided into rod- or strip-shaped elements 9. As shown in FIGS. 3A to 4B, the cross-section of the measuring element 1 is divided into slender elements 9, such that a number of thin individual elements are obtained from a large crystal block or plate. The material for the supports 2, 3 is selected such that their lateral extension and/or thermal expansion match the values of the measuring element in longitudinal direction of the slender elements 9 (arrow a in FIGS. 3B and 4B). As a consequence, no differences will be encountered between the expansion of supports 2, 3 and measuring element 1 in longitudinal direction of the individual elements, and thus no strain, breakage or influences on the measurement signal. In some instances it will suffice to match the elongation coefficient of the support with the corresponding coefficient in longitudinal direction of the slender individual crystal elements. In measuring elements subject to low mechanical but high thermal loads, a maximum of advantages are reached by matching thermal expansion coefficients; in measuring elements essentially operating at constant temperature under high mechanical load, it will suffice to match the coefficients of lateral extension. Although comparatively larger stresses will occur in the direction of the small face of the rod-shaped individual elements compared to a conventional support with average elongation coefficients, the influence of these stresses on material strength and measurement signal can be limited to a predefined degree by suitable choice of the width of the individual elements 9.

If thin longitudinal elements are used, such as presented in FIGS. 4A or 4B, the crystal is prevented from breaking by dividing it into individual crystals, if the friction-transmitted force at the pressure faces 4, 5 is smaller than the breaking force dependent on the strength and cross-section of the crystal.

Disregarding stress reduction due to elasticity, there will be no risk of breaking as long as $$s * L * \sigma_B > F * \mu$$

For this $F = b * L * p$
means $s * L * \sigma_B > b * L * p * \mu$
hence
$$b < \frac{\sigma_B * s}{p * \mu}$$

s, L, b . . . thickness, length, width of crystal element 9
$\sigma_B$ . . . breaking strength of crystal element 9 across its width
F . . . total pressure force on measuring element 1
$\mu$ . . . coefficient of friction between measuring element 1 and support p . . . pressure in the contact surface between measuring element and support In transversal elements of large height, such as in FIGS. 3A and 3B, similar relationships are obtained for an increase in breaking strength, with the additional advantage that differences in lateral extension at the interface between the rod-shaped elements 9 of the measuring element 1 and the supports 2, 3 will be effective in the direction of pressure or height of the measuring element 1 only in regions corresponding to the width of the contact zone. Very thin rod-shaped elements 9, whose expansion differs from that of support 2 or 3, only slightly on account of their small thickness, remain largely unaffected by disturbances at the contact zone (see FIG. 3A).

As is shown in FIG. 5, the size of the affected areas may be minimized by reducing thickness D of the individual elements 9. The remaining influence on the measurement signal may be eliminated by picking up charge for the force-proportional measurement signal only in the undisturbed areas 10, while short-circuiting charge from affected areas 11. This is achieved by providing that part of the electrode 6 short-circuit the affected area 11 next to support 2, and part of the electrode 7 short-circuit the affected area 11 next to support 3. It is only the charges picked up in the undisturbed area 10 that are used for the measurement signal.

Effects which are similar to those achieved by dividing the anisotropic measuring element 1 may be obtained by providing that the end regions 16, 17 of the isotropic supports 2, 3 have an anisotropic shape. As is shown in FIGS. 6A to 9, it is possible by dividing the compact supports 2, 3 into slender, rib-shaped elements 12, for example, and matching lateral extension and/or thermal expansion behavior in longitudinal direction of these elements 12 with the corresponding crystal expansion of the measuring element, to completely eliminate strains between measuring element 1 and support 2, 3 in this direction (see arrow a). The stresses occurring in the direction (see arrow b) transverse to the slender elements 12 due to differences in expansion in this direction may be limited to a tolerable degree by suitably choosing the width of the slender rib-shaped elements 12. In contrast to dividing the measuring element into rod-shaped elements, the slender elements 12 undergo displacements in transverse direction (caused by expansion due to thermal or mechanical load) at the contact zone with the anisotropic measuring element, which are different from the displacements at the interface with the adjacent isotropic support (2, 3) whose lateral extension is matched with the crystal expansion in longitudinal direction of the slender elements 12. As a consequence, the slender rib-shaped elements 12 will tilt (see FIG. 6A), entailing the risk of edge pressure and breaking for the brittle measuring element 1. The risk of edge pressure may be minimized by making the slender ribs 12 of the supports 2 and 3 as high as possible, although this will strongly reduce the rigidity of the support in lateral direction.

An axial shift of supports 2, 3 in the direction of the applied force F—caused by tilting ribs 12—may be eliminated by suitable shaping of the contact faces between the rib-shaped elements 12 and the measuring element 1 or some intermediate layer. For example, the contact faces may be given a shape which permits them to roll on their counterpiece without causing an axial lift of the support 3 (see FIG. 8). To minimise the risk of breaking the free ends of the rib-shaped elements 12 next to the piezoelectric measuring element 1 may be smoothed off to a cylindrical shape, the radius r approximately corresponding to the height of the rib-shaped elements 12.

Another possibility of eliminating the risk of breaking is provided by adding an intermediate layer 13 between each support 2, 3 and the piezoelectric measuring element 1, which layer 13 is made of elastic, pressure-resistant material, preferably metal or metal alloy. Due to the use of an intermediate layer 13 of elastic, strong and tough material, which is resistant to the high stresses induced by edge pressure, the stresses are distributed over a sufficiently large surface or area 14 before they reach the measuring element 1 (see FIG. 7D as detail D of FIG. 7A). Suitable materials usually exhibit isotropic expansion, i.e., they will cause strains in cooperation with the anisotropic measuring element 1 in the instance of thermal expansion or lateral extension. The anisotropic shape described above, i.e., division into slender, strip-shaped elements 15, is also advantageous for the intermediate layer 13, the longitudinal direction of elements 15 being normal to that of the rib-shaped elements 12, or of rollers or roller segments 18 (see FIG. 7B).

Figure 9:
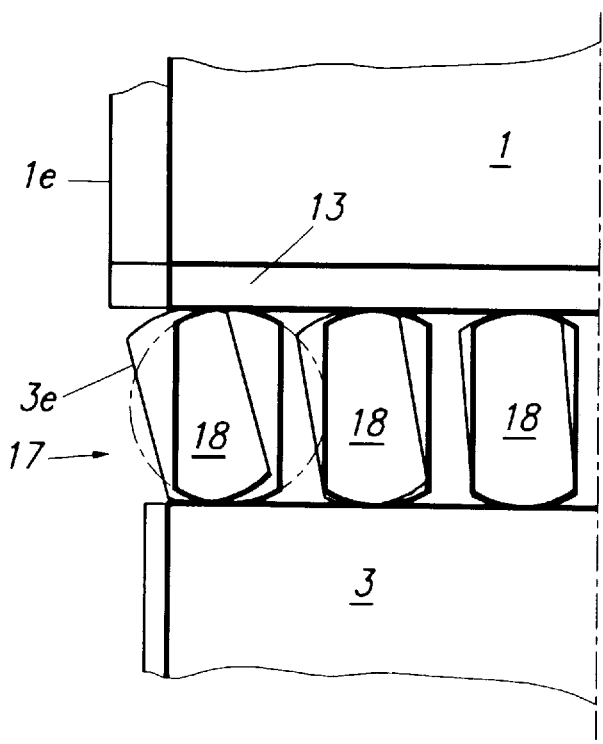

Another simple design of a support free of axial lifts, which will admit differences in lateral extension in a practically force-free manner, is that of a roller bearing such as presented in FIG. 9, where rollers or roller segments 18 are employed. Thermal expansion and/or load-induced lateral extension of all parts in contact with each other, i.e., measuring element 1, roller segment 18, and support 3, must be matched in the direction of the roller axes. This variant is also characterised by edge pressure at the contact faces, which may be reduced by means of an intermediate layer 13, in order to diminish the risk of breaking.

In the variants according to FIGS. 6A to 8 the risk of the measuring element 1 tilting out of the support laterally, will grow with increasing height of the rib-shaped elements 12 and decreasing width of the ribs—either of which would assist in avoiding strong edge pressure and lateral stress. This may create problems as regards impact resistance or resonant frequency. Roller-type elements or roller segments 18 cannot take up any lateral forces, of course. The ensuing problems may be solved by providing that the longitudinal direction of the rib-shaped elements 12 or roller segments 18 of one support 2 be normal to the longitudinal direction of the rib-shaped elements 12 or roller segments 18 of the other support 3. The rib-shaped elements 12 or rollers or roller segments 18 must be matched in this variant with the expansion of the measuring element 1 acting in their respective longitudinal direction, i.e., they must exhibit different longitudinal expansion on each side of the measuring element 1. This will provide a comparatively rigid, impact-resistant method of supporting the measuring element, with high resonant frequency.

I claim:

1. Measuring device with a piezoelectric measuring element positioned between two force-transmitting supports, said piezoelectric measuring element exhibiting anisotropic thermal expansion and lateral extension behavior relative to said two supports in a plane transverse to a direction of force application, said piezoelectric measuring element being held in said plane by friction forces at said two supports, wherein said piezoelectric measuring element is divided into several rod-, roller-, or rib-shaped elements, and wherein said two supports and said piezoelectric measuring element exhibit substantially the same thermal expansion or lateral extension in longitudinal direction of said rod-, roller-, or rib-shaped elements which is transverse to said direction of force application.

2. Measuring device according to claim 1, wherein said two supports consist of isotropic material and said piezoelectric measuring element is divided into slender rod-shaped elements having a thermal expansion and a lateral extension which is substantially the same in longitudinal direction as that of said isotropic supports.

3. Measuring device according to claim 1, using a transversal piezoelectric body as said piezoelectric measuring element, wherein areas of said measuring piezoelectric element affected by thermal expansion are electrically short-circuited by electrodes, while charge pick-up takes place in an undisturbed area in the middle of said piezoelectric measuring element.

4. Measuring device according to claim 1, using a transversal piezoelectric body as said piezoelectric measuring element, wherein areas of said piezoelectric measuring element affected by lateral extension are electrically short-circuited by electrodes, while charge pick-up takes place in an undisturbed area in the middle of said piezoelectric measuring element.

5. Measuring device with a piezoelectric measuring element, positioned between two force-transmitting supports, having end regions adjacent to said piezoelectric measuring element, which exhibits anisotropic thermal expansion and lateral extension behavior relative to said two supports in a plane transverse to a direction of force application, said piezoelectric measuring element being held in said plane by friction forces at said two supports, wherein said end regions of said two supports are divided into several rod-, roller-, or rib-shaped elements, and wherein said two supports and said piezoelectric measuring element exhibit substantially the same thermal expansion or lateral extension in a longitudinal direction of said rod-, roller-, or rib-shaped elements which is transverse to said direction of force application.

6. Measuring device according to claim 5, wherein said end regions of said two supports of isotropic material adjacent to said piezoelectric measuring element have rib-shaped elements, having a thermal expansion and a lateral extension which is matched in longitudinal direction with that of said piezoelectric measuring element.

7. Measuring device according to claim 6, wherein free ends of said rib-shaped elements adjacent to said piezoelectric measuring element exhibit a shape which permits contact faces thereof to roll on said measuring element without causing an axial lift of said supports.

8. Measuring device according to claim 6, wherein the longitudinal direction of said rib-shaped elements of one of said two supports is normal to the longitudinal direction of said rib-shaped elements, of said other support.

9. Measuring device according to claim 5, wherein said end regions of said two supports of isotropic material adjacent to said piezoelectric measuring element have rollers or roller segments, having a thermal expansion and a lateral extension which is matched in longitudinal direction with that of said piezoelectric measuring element.

10. Measuring device according to claim 9, wherein the longitudinal direction of said rollers or roller segments of one of said two supports is normal to the longitudinal direction of said rollers or roller segments of said other support.

11. Measuring device according to claim 6, wherein an intermediate layer is added between each of said two supports and said piezoelectric measuring element, said layer is made of elastic, pressure-resistant material, preferably metal or metal alloy.

12. Measuring device according to claim 9, wherein an intermediate layer is added between each of said two supports and said piezoelectric measuring element, said layer is made of elastic, pressure-resistant material, preferably metal or metal alloy.

13. Measuring device according to claim 11, wherein said intermediate layer is divided into several strip-shaped elements, having a longitudinal direction which is normal to that of said rib-shaped elements.

14. Measuring device according to claim 12, wherein said intermediate layer is divided into several strip-shaped elements, having a longitudinal direction which is normal to that of said rollers or roller segments.

* * * * *